(12) United States Patent
Yang et al.

(10) Patent No.: US 9,543,547 B2
(45) Date of Patent: Jan. 10, 2017

(54) OLED DISPLAY APPARATUS AND THE PRODUCTION METHOD THEREOF

(71) Applicants: BOE Technology Group Co., Ltd., Beijing (CN); Beijing BOE Optoelectronics Technology Co., Ltd., Beijing (CN)

(72) Inventors: Jiuxia Yang, Beijing (CN); Feng Bai, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 14/800,906

(22) Filed: Jul. 16, 2015

(65) Prior Publication Data
US 2016/0268552 A1   Sep. 15, 2016

(30) Foreign Application Priority Data
Mar. 11, 2015 (CN) .......................... 2015 1 0106575

(51) Int. Cl.
*H01L 51/52* (2006.01)
(52) U.S. Cl.
CPC ................. *H01L 51/5275* (2013.01)
(58) Field of Classification Search
CPC .......................... H01L 51/5275; H01L 33/42
See application file for complete search history.

(56) References Cited

U.S. PATENT DOCUMENTS

2011/0180836 A1*  7/2011  Son ..................... H01L 27/3283
                                                              257/98

* cited by examiner

*Primary Examiner* — Kyoung Lee
(74) *Attorney, Agent, or Firm* — Westman, Champlin & Koehler, P.A.

(57) ABSTRACT

This disclosure provides an OLED display apparatus and the production method thereof, for decreasing the microcavity effect and improving the intensity of the light emitted by the OLED display apparatus. The OLED display apparatus comprises: an array substrate and an OLED device which is provided on the array substrate and comprises an anode, an organic light-emitting layer and a cathode in this order along the direction away from the array substrate, and further comprises: a refractive layer positioned between the array substrate and the anode, wherein the refractive index of the refractive layer is greater than that of the anode. In the above-mentioned OLED display apparatus, by providing a refractive layer, the refractive index of which is greater than that of an anode in an OLED device, the occurrence of total reflection phenomenon when light is irradiated onto an array substrate is reduced and thereby the microcavity effect is reduced, and it is allowed that the light is refracted from the surface of the array substrate as much as possible and the light-emitting intensity of the OLED display apparatus is improved.

14 Claims, 2 Drawing Sheets

OLED DISPLAY APPARATUS AND THE PRODUCTION METHOD THEREOF

CROSS-REFERENCE TO RELATED APPLICATION

This Application is a non-provisional Application of Chinese Application No. CN 201510106575.6, filed on Mar. 11, 2015, in Chinese, the contents of which are hereby incorporated by reference in their entirety.

FIELD OF THE INVENTION

This disclosure relates to the field of display technology, and particularly to an OLED display apparatus and the production method thereof.

BACKGROUND OF THE INVENTION

Display employing OLEDs (Organic Light-Emitting Diodes) are a kind of novel flat panel displays and have a wide prospect for application due to the advantages, such as simple production process, low cost, high response speed, easiness of color display and large-screen display, low power consumption, easiness of matching with integrated circuit drivers, high light-emitting brightness, broad adaptable range of working temperature, light and thin bulk, easiness of flexible display, and the like.

As shown in FIG. 1, which is a schematic diagram of the structure of an OLED display apparatus in the prior art, an OLED display apparatus in the prior art typically comprises an array substrate 01 and an OLED which is provided on the array substrate 01, wherein the OLED device 02 comprises: an anode 021, a planarizing layer 022, a hole injection layer 023, a hole transport layer 024, an organic light-emitting layer 025, an electron transport layer 026, an electron injection layer 027 and a cathode 028 in this order along the direction away from the array substrate, wherein the above-mentioned anode 021 is usually produced using ITO. Since microcavity structures are present between the anode 021 and the array substrate 01 while there is a relatively high microcavity effect between the anode produced from ITO and the array substrate 01, it is allowed that total reflection occurs in a part of light when the light is irradiated onto the array substrate, and in turn it is allowed that conversion efficiency of light by the OLED display apparatus decreases, resulting in low intensity of the light emitted by the OLED display apparatus.

SUMMARY OF THE INVENTION

An Example of this disclosure provides an OLED display apparatus and the production method thereof, for decreasing the microcavity effect and improving the intensity of the light emitted by the OLED display apparatus.

To achieve the object described above, this disclosure provides the following technical solutions:

This disclosure provides an OLED display apparatus, comprising: an array substrate and an OLED device which is provided on the array substrate and comprises an anode, an organic light-emitting layer and a cathode in this order along the direction away from the array substrate, wherein the OLED display apparatus further comprises:

a refractive layer positioned between the array substrate and the anode, wherein the refractive index of the refractive layer is greater than that of the anode.

An Example of this disclosure provides an OLED display apparatus, wherein by providing a refractive layer, the refractive index of which is greater than that of an anode in an OLED device, the occurrence of total reflection phenomenon when light is irradiated onto a array substrate is reduced and thereby the microcavity effect is reduced, and it is allowed that the light is refracted from the surface of the array substrate as much as possible and the light-emitting intensity of the OLED display apparatus is improved.

In some optional embodiments, the refractive index of the refractive layer is 1.55~2.55.

In some optional embodiments, the refractive layer comprises 33.3% by weight~83.3% by weight of glass powder and 11.1% by weight~57.15% by weight of a resin.

In some optional embodiments, the glass powder comprises bismuth oxide or boron oxide.

In some optional embodiments, the resin is a cellulose resin.

In some optional embodiments, the cellulose resin is selected from one or more of methyl cellulose, ethyl cellulose, carboxyethyl cellulose, carboxymethyl cellulose, and carboxymethyl hydroxyethyl cellulose.

This disclosure further provides a method for producing an OLED display apparatus, comprising the steps of:

preparing a coating composition for forming a refractive layer;

coating the coating composition for forming a refractive layer on an array substrate by a coating process to form a coating layer;

subjecting the coating layer to drying and curing treatments by a vacuum baking process and a sintering process sequentially to form the refractive layer, wherein the refractive index of the refractive layer is greater than that of an anode; and forming an OLED device on the refractive layer.

In some optional embodiments, the refractive index of the refractive layer is 1.55~2.55.

In some optional embodiments, the coating composition for forming a refractive layer comprises 15% by weight~25% by weight of glass powder, 5% by weight~20% by weight of a resin, and 40% by weight~70% by weight of a solvent.

In some optional embodiments, the glass powder comprises bismuth oxide or boron oxide.

In some optional embodiments, the resin is a cellulose resin.

In some optional embodiments, the cellulose resin is selected from one or more of methyl cellulose, ethyl cellulose, carboxyethyl cellulose, carboxymethyl cellulose, and carboxymethyl hydroxyethyl cellulose.

In some optional embodiments, the solvent is selected from one or more of terpineol, 2,2,4-trimethyl-1,3-pentanediol monoisobutyrate, diethylene glycol butyl ether acetate, dipropyl ether, diethylene glycol monobutyl ether, 1,2-propylene glycol carbonate, ethylene glycol carbonate, o-dinitrobenzene, m-dinitrobenzene, tetraethylene glycol dimethyl ether, ethylene glycol phenyl ether, triphenyl phosphate, and tricresyl phosphate.

In some optional embodiments, the step of subjecting the coating layer to drying and curing treatments by a vacuum baking process and a sintering process sequentially comprises:

baking the coating layer at a temperature of 80~120° C. for 10~30 min to dry the coating layer; and sintering the coating layer under an environment of nitrogen gas at 400~450° C. for 60~180 min to cure the coating layer, thereby obtaining the refractive layer.

In some optional embodiments, the step of coating the coating composition for forming a refractive layer on an array substrate by a coating process to form a coating layer comprises:

forming the coating layer on an array substrate by a process of spin coating or slit-spin coating.

Figure 1:
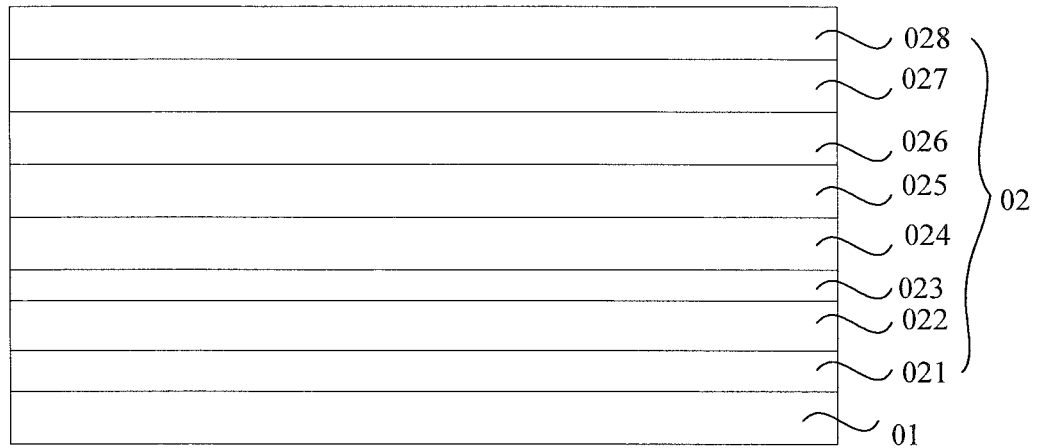
FIG. 1 is a schematic diagram of the structure of an OLED display apparatus in the prior art.

| Reference Numerals: | |
|---|---|
| 01 - array substrate | 02 - OLED device |
| 021 - anode | 022 - planarizing layer |
| 023 - hole injection layer | 024 - hole transport layer |
| 025 - organic light-emitting layer | 026 - electron transport layer |
| 027 - electron injection layer | 028 - cathode |
| 1 - array substrate | 2 - refractive layer |
| 3 - OLED device | 31 - anode |
| 32 - planarizing layer | 33 - hole injection layer |
| 34 - hole transport layer | 35 - organic light-emitting layer |
| 36 - electron transport layer | 37 - electron injection layer |
| 38 - cathode | |

DETAILED DESCRIPTION OF THE INVENTION

The technical solutions in Examples of this disclosure will be clearly and fully described below in conjunction with accompanying drawings in Examples of this disclosure. Obviously, the Examples described are merely a part of the Examples of this disclosure, rather than all of the Examples. Based on the Examples of this disclosure, all other Examples obtained by those of ordinary skill in the art without performing inventive work belong to the scope protected by this disclosed patent.

Figure 2:
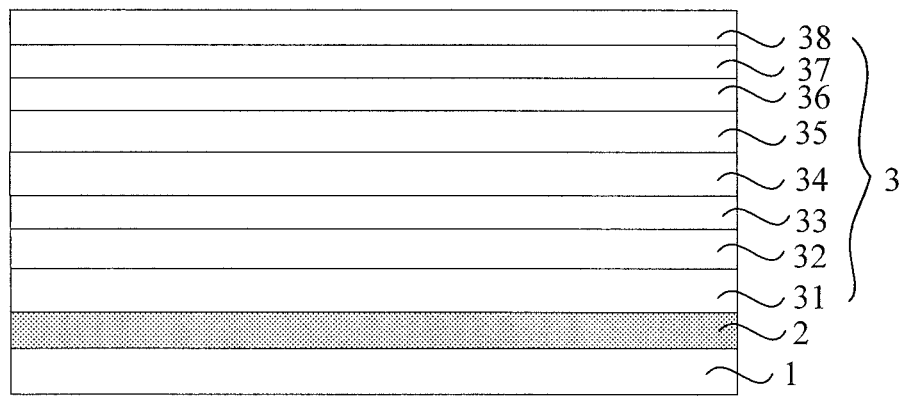
FIG. 2 is a schematic diagram of the structure of an OLED display apparatus provided in an Example of this disclosure.
Figure 3:
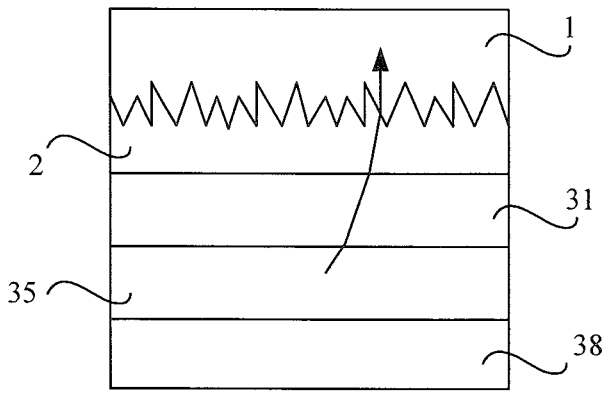
FIG. 3 is a schematic diagram of the light propagation of an OLED display apparatus provided in an Example of this disclosure.

As shown in FIG. 2 and FIG. 3, in which: FIG. 2 is a schematic diagram of the structure of an OLED display apparatus provided in an Example of this disclosure, and FIG. 3 is a schematic diagram of the light propagation of an OLED display apparatus provided in an Example of this disclosure. This disclosure provides an OLED display apparatus, comprising: an array substrate 1 and an OLED device 3 which is provided on the array substrate 1 and comprises an anode 31, an organic light-emitting layer 35, and a cathode 38 in this order along the direction away from the array substrate 1, wherein the OLED display apparatus further comprises:

a refractive layer 2 positioned between the array substrate 1 and the anode 31, wherein the refractive index of the refractive layer 2 is greater than that of the anode 31.

In the OLED display apparatus provided by an Example of this disclosure, by providing a refractive layer 2, the refractive index of which is greater than that of an anode 31 in an OLED device, the occurrence of total reflection phenomenon when light is irradiated onto a array substrate 1 is reduced and thereby the microcavity effect is reduced, and it is allowed that the light is refracted from the surface of the array substrate as much as possible (as shown in FIG. 3) and the light-emitting intensity of the OLED display apparatus is improved.

As shown in FIG. 2, the above-mentioned OLED display apparatus is similar to the OLED display apparatus in the prior art. The OLED display device 3 comprises: an anode 31, a planarizing layer 32, a hole injection layer 33, a hole transport layer 34, an organic light-emitting layer 35, an electron transport layer 36, an electron injection layer 37, and a cathode 38. The above-mentioned planarizing layer may be optionally provided or not.

Preferably, the refractive index of the above-mentioned refractive layer 2 is 1.55~2.55. For example, 1.55, 1.65, 1.7, 2.0, 2.2, 2.4, 2.55, etc., and verbose words are omitted herein. When light is refracted at the interface between the anode and the refractive layer, since the refractive index of the refractive layer is greater than that of the anode, the light will be completely refracted and total reflection will not occur. Furthermore, when the light is irradiated onto the interface between the array substrate and the refractive layer, the occurrence of total reflection phenomenon will be as little as possible and most of the light will be refracted, and in turn the intensity of the light emitted by the OLED display apparatus will be improved.

The specific components of the above-mentioned refractive layer may be various. In a particular embodiment, the refractive layer 2 comprises 33.3% by weight~83.3% by weight of glass powder and 11.1% by weight~57.15% by weight of a resin.

Further, the glass powder comprises bismuth oxide or boron oxide. The refractive index of boron oxide is 1.63, and the refractive index of bismuth oxide is 1.9. Bismuth oxide and boron oxide are low-melting glass materials and have the function of preventing the permeation of moisture. Therefore, by designing a refractive layer of this material on a display device, the outer electron coupling efficiency of an OLED display apparatus can be improved, and at the same time, the problem with lifetime decrease of the OLED display apparatus caused by the permeation of outside moisture can be prevented.

Furthermore, the above-mentioned resin is a cellulose resin. The refractive index of the resin material according to this disclosure is around 1.57. Particularly, the cellulose resin includes one or more of methyl cellulose, ethyl cellulose, carboxyethyl cellulose, carboxymethyl cellulose, and carboxymethyl hydroxyethyl cellulose.

Optionally, the solvent includes one or more of terpineol, 2,2,4-trimethyl-1,3-pentanediol monoisobutyrate, diethylene glycol butyl ether acetate, dipropyl ether, diethylene glycol monobutyl ether, 1,2-propylene glycol carbonate, ethylene glycol carbonate, o-dinitrobenzene, m-dinitrobenzene, tetraethylene glycol dimethyl ether, ethylene glycol phenyl ether, triphenyl phosphate, and tricresyl phosphate.

Figure 4:
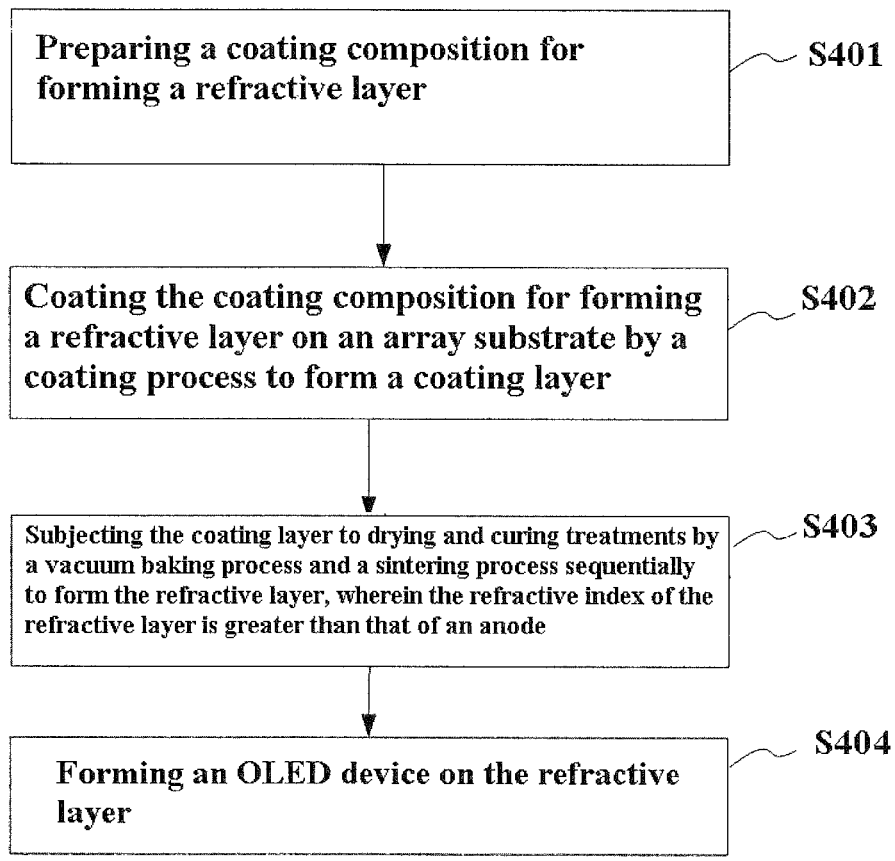
FIG. 4 is a flow chart of a production method of an OLED display apparatus provided in an Example of this disclosure.

As shown in FIG. 4, which is a flow chart of a production method of an OLED display apparatus provided in an Example of this disclosure, this disclosure further provides a method for producing an OLED display apparatus, comprising the steps of:

step S401: preparing a coating composition for forming a refractive layer;

step S402: coating the coating composition for forming a refractive layer on an array substrate by a coating process to form a coating layer;

step S403: subjecting the coating layer to drying and curing treatments by a vacuum baking process and a sintering process sequentially to form the refractive layer, wherein the refractive index of the refractive layer is greater than that of an anode; and step S404: forming an OLED device on the refractive layer.

Further, with respect to the above-mentioned step S401, a coating composition for forming a refractive layer is produced by the conventional techniques known in the art (e.g., by mixing under stirring).

With respect to the above-mentioned step S402, the coating layer is formed on an array substrate by the conventional techniques known in the art (e.g., by the process of spin coating or slit-spin coating).

With respect to the above-mentioned step S403, subjecting the coating layer to drying and curing treatments by a vacuum baking process and a sintering process sequentially comprises:

baking the coating layer at a temperature of 80~120° C. for 10~30 min to dry the coating layer; and sintering the coating layer under an environment of nitrogen gas at 400~450° C. for 60~480 min to cure the coating layer, thereby obtaining the refractive layer.

With respect to the above-mentioned step S404, forming an OLED device on the refractive layer specifically comprises:

producing an anode using the processes of magnetron sputtering and etching;

producing a planarizing layer on the anode, wherein the above-mentioned planarizing layer may be optionally provided or not;

forming a hole injection layer, a hole transport layer, an organic light-emitting layer, an electron transport layer, an electron injection layer, and a cathode layer using a vacuum deposition process or a painting and printing process; and performing packaging and module production on an display device after the above-mentioned processes are finished.

Test Methods

Test for the Performance of Light-Emitting Intensity

The light-emitting intensity of the OLED display apparatus is measured according to National Standard GB/T 20871.61 of People's Republic of China.

EXAMPLES

This disclosure provides the following Examples to specifically describe this invention. It is to be indicated that these Examples are not intended to limit the scope of this invention.

Example 7.5 g of glass powder (a mixture of bismuth oxide and boron oxide, wherein the weight ratio in percentage is 4:1), 2.5 g of methyl cellulose resin, and 25 g of terpineol were uniformly mixed to prepare a coating composition for forming a refractive layer.

A coating layer was produced on a glass substrate using the coating process of screen printing, wherein the thickness of the coating layer was 1.5 μm and the weight ratio in percentage of the glass powder and the methyl cellulose resin in the composition was 75:25.

The coating layer was baked at a temperature of 100° C. for 20 min to dry the coating layer.

The coating layer was sintered under an environment of nitrogen gas at 420° C. for 100 min to cure the coating layer, thereby obtaining the refractive layer.

An anode, a planarizing layer, a hole injection layer, a hole transport layer, an organic light-emitting layer, an electron transport layer, an electron injection layer, and a cathode were sequentially formed on the refractive layer by the prior art method.

The light-emitting intensity of the obtained OLED display apparatus was measured by the above-listed testing method for the performance of light-emitting intensity.

Comparative Example

An OLED display apparatus was prepared by the same method as in the Example except that the refractive layer was not introduced, wherein the light-emitting intensity of the obtained OLED display apparatus was measured by the above-listed testing method of light-emitting intensity performance.

From the measurement results, it can be known that the light-emitting intensity of the OLED display apparatus according to the Example has been improved by 25%, compared to the OLED display apparatus without using the refractive layer in the Comparative Example.

Obviously, the person skilled in the art may perform various modifications and variations on this invention without deviating from the spirit and the scope of this invention. Thus, if these modifications and variations of this invention are within the scope of the claims of this invention and equivalent techniques thereof, this invention also intends to encompass these modifications and variations.

What is claimed is:

1. An OLED display apparatus, comprising: an array substrate and an OLED device which is provided on the array substrate and comprises an anode, an organic light-emitting layer and a cathode in this order along the direction away from the array substrate, wherein the OLED display apparatus further comprises:
a refractive layer positioned between the array substrate and the anode, wherein the refractive index of the refractive layer is greater than that of the anode,
wherein the refractive layer comprises 33.3% by weight~83.3% by weight of glass powder and 11.1% by weight~57.15% by weight of a resin.

2. The OLED display apparatus as claimed in claim 1, wherein the refractive index of the refractive layer is 1.55~2.55.

3. The OLED display apparatus as claimed in claim 1, wherein the glass powder comprises bismuth oxide or boron oxide.

4. The OLED display apparatus as claimed in claim 3, wherein the resin is a cellulose resin.

5. The OLED display apparatus as claimed in claim 4, wherein the cellulose resin is selected from one or more of methyl cellulose, ethyl cellulose, carboxyethyl cellulose, carboxymethyl cellulose, and carboxymethyl hydroxyethyl cellulose.

6. A method for producing an OLED display apparatus, comprising the steps of:
preparing a coating composition for forming a refractive layer;
coating the coating composition for forming a refractive layer on an array substrate by a coating process to form a coating layer;
subjecting the coating layer to drying and curing treatments by a vacuum baking process and a sintering process sequentially to form the refractive layer, wherein the refractive index of the refractive layer is greater than that of an anode; and
forming an OLED device on the refractive layer.

7. The method for producing an OLED display apparatus as claimed in claim 6, wherein the refractive index of the refractive layer is 1.55~2.55.

8. The method for producing an OLED display apparatus as claimed in claim 7, wherein the coating composition for forming a refractive layer comprises 15% by weight~25% by weight of glass powder, 5% by weight~20% by weight of a resin, and 40% by weight~70% by weight of a solvent.

9. The method for producing an OLED display apparatus as claimed in claim 8, wherein the glass powder comprises bismuth oxide or boron oxide.

10. The method for producing an OLED display apparatus as claimed in claim 9, wherein the resin is a cellulose resin.

11. The method for producing an OLED display apparatus as claimed in claim 10, wherein the cellulose resin is selected from one or more of methyl cellulose, ethyl cellulose, carboxyethyl cellulose, carboxymethyl cellulose, and carboxymethyl hydroxyethyl cellulose.

12. The method for producing an OLED display apparatus as claimed in claim 11, wherein the solvent is selected from one or more of terpineol, 2,2,4-trimethyl-1,3-pentanediol monoisobutyrate, diethylene glycol butyl ether acetate, dipropyl ether, diethylene glycol monobutyl ether, 1,2-propylene glycol carbonate, ethylene glycol carbonate, o-dinitrobenzene, m-dinitrobenzene, tetraethylene glycol dimethyl ether, ethylene glycol phenyl ether, triphenyl phosphate, and tricresyl phosphate.

13. The method for producing an OLED display apparatus as claimed in claim 6, wherein the step of subjecting the coating layer to drying and curing treatments by a vacuum baking process and a sintering process sequentially comprises:
   baking the coating layer at a temperature of 80~120° C. for 10~30 min to dry the coating layer; and
   sintering the coating layer under an environment of nitrogen gas at 400~450° C. for 60~180 min to cure the coating layer, thereby obtaining the refractive layer.

14. The method for producing an OLED display apparatus as claimed in claim 6, wherein the step of coating the coating composition for forming a refractive layer on an array substrate by a coating process to form a coating layer comprises:
   forming the coating layer on an array substrate by a process of spin coating or slit-spin coating.

* * * * *